(12) United States Patent
Apel

(10) Patent No.: US 6,762,647 B1
(45) Date of Patent: Jul. 13, 2004

(54) ACTIVE PROTECTION CIRCUIT FOR LOAD MISMATCHED POWER AMPLIFIER

(75) Inventor: Thomas R. Apel, Portland, OR (US)

(73) Assignee: TriQuint Semiconductor, Inc., Hillsboro, OR (US)

( * ) Notice: Subject to any disclaimer, the term of this patent is extended or adjusted under 35 U.S.C. 154(b) by 0 days.

(21) Appl. No.: 10/215,802

(22) Filed: Aug. 9, 2002

(51) Int. Cl.[7] .............................................. H03G 3/10
(52) U.S. Cl. ..................................... 330/279; 330/285
(58) Field of Search ................................. 330/133, 140, 330/279, 280–285, 302, 310; 327/306, 309–314, 323–328

(56) References Cited

U.S. PATENT DOCUMENTS

| 4,199,797 | A | * | 4/1980 | Kusumi | ........................ 361/56 |
| 4,631,737 | A | * | 12/1986 | Davis et al. | ................. 375/334 |
| 5,179,353 | A | * | 1/1993 | Miyake | ....................... 330/129 |
| 6,208,209 | B1 | * | 3/2001 | Ng | ............................... 330/279 |
| 6,580,321 | B1 | * | 6/2003 | Arell et al. | ............... 330/207 P |
| 2003/0045251 | A1 | | 3/2003 | Arnott | |

* cited by examiner

Primary Examiner—Timothy P. Callahan
Assistant Examiner—An T. Luu
(74) Attorney, Agent, or Firm—Bever, Hoffman & Harms, LLP; James E. Parsons

(57) ABSTRACT

A peak detector detects an amplifier output overvoltage condition if the amplifier drives a mismatched load impedance. In response to the detected overvoltage condition, a clamping transistor lowers a reference DC bias voltage supplied by a bias circuit to the amplifier. The lowered reference DC bias voltage lowers amplifier gain and output power, thus protecting the amplifier.

40 Claims, 2 Drawing Sheets

ACTIVE PROTECTION CIRCUIT FOR LOAD MISMATCHED POWER AMPLIFIER

BACKGROUND

1. Field of Invention

The invention is related to radio frequency (RF) power amplifier protection circuits.

2. Related Art

RF power amplifiers are intended to operate into a particular load impedance. This load impedance is typically set by an impedance matching circuit coupled to an antenna (load) used to radiate the amplified RF signal. In mobile transmitters (e.g., a cellular telephone handset), the proximity of the antenna to nearby objects (e.g., metal shopping carts) changes the load impedance.

In load mismatch situations, excess amplifier output power fails to reach the load and must be dissipated by one or more power amplifier transistors in the amplifier. In severe load mismatch conditions, this dissipated power damages or destroys the transistors. To preserve the transistors, the RF power amplifier must withstand load impedances that are mismatched to the load impedance for which the amplifier was designed. However, not all integrated circuit power transistors are capable of withstanding highly mismatched load impedances. Therefore, what is required is a device and a method to effectively protect the power transistors.

SUMMARY

A radio frequency (RF) amplifier driving a highly mismatched load impedance outputs an RF voltage that is over a predetermined level (overpeak voltage). A peak detector is used to detect the overpeak voltage. If an output overpeak voltage is detected, an emitter follower buffer is used to activate a clamping transistor. The clamping transistor is coupled to the output of a bias circuit, and the activated clamping transistor is used to limit a reference DC bias voltage output from the bias circuit. The reference DC voltage is applied to an RF amplifier—either the amplifier producing the RF output voltage being detected, or a previous amplifier in an amplifier chain that ends with the amplifier producing the RF output voltage being detected. The limited reference DC bias voltage limits the gain of the amplifier. Consequently, the output power of the amplifier producing the overpeak voltage being detected is reduced. Thus, the amplifier is protected when driving a highly mismatched load impedance.

In one embodiment a set of diodes is coupled in series between the output of the amplifier being protected and ground. The anode of a peak detector diode is coupled to a node between two diodes in the diode set. The number of semiconductor junctions between the amplifier output and the peak detector diode anode determines the detected voltage. The cathode of the peak detector diode is coupled to the base of an emitter follower buffer and to a capacitor shunting AC to ground. The emitter of the emitter follower is coupled to the base of a clamping transistor. The collector of the clamping transistor is coupled to the collector of a bias transistor. The activated clamping transistor limits the bias transistor collector voltage, which is used as the reference voltage output to the amplifier. In some embodiments the emitter of the emitter follower buffer is coupled to the base of two or more clamping transistors, each clamping transistor being associated with a unique bias circuit. Each unique bias circuit provides a clamped reference voltage to an amplifier in a chain of amplifiers.

DETAILED DESCRIPTION

Figure 1:
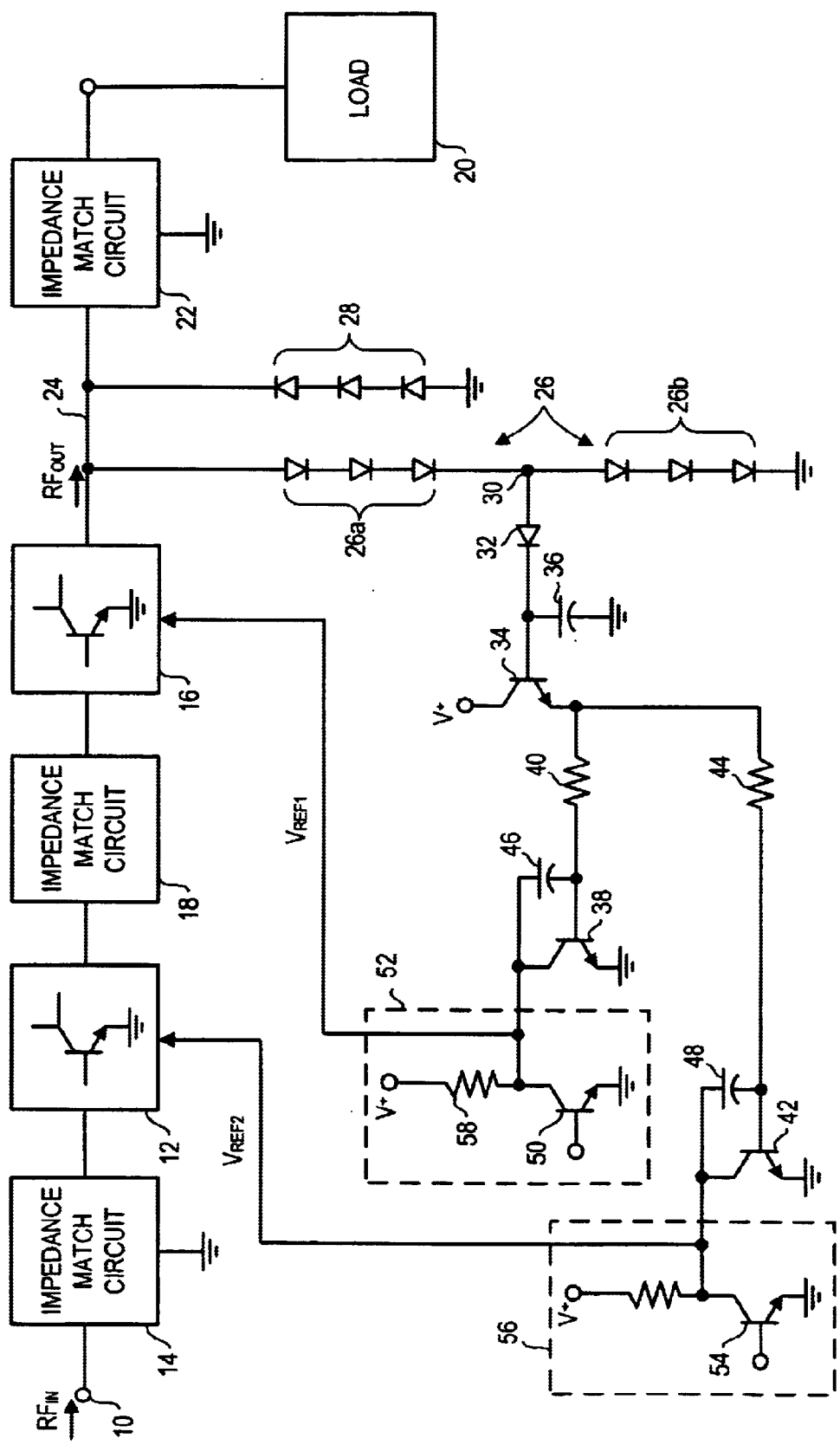
FIG. 1 is a combined diagrammatic and schematic view of an electronic circuit that includes an amplifier and a protection circuit for the amplifier.

Skilled individuals will understand that certain known circuit elements are omitted from the accompanying drawing so as to more clearly illustrate the embodiment. Skilled individuals will also understand that electrical components such as resistors, capacitors, and diodes are selected due to the electrical properties they possess, and that various actual devices may provide the desired electrical properties. For example, in some embodiments the diodes are diode-connected bipolar transistors. The V+ symbol in the drawings illustrates a supply voltage and is not necessarily the same value at each indicated point.

FIG. 1 is a combined diagrammatic and schematic view showing an embodiment of the invention. One embodiment is formed in a gallium arsenide (GaAs) integrated circuit. Other embodiments are formed in other semiconductor materials. As shown in FIG. 1, radio frequency (RF) input signal RFIN to be transmitted is received at input terminal 10 and is passed to RF driver amplifier 12 via input impedance matching circuit 14. Driver amplifier 12 subsequently outputs the RF signal to RF final power amplifier 16 via interstage impedance matching circuit 18. Power amplifier 16 then outputs signal RFOUT to load 20 (e.g., an antenna) via output impedance matching circuit 22. In one embodiment, all electrical circuit elements other than load 20 and impedance matching circuit 22 are formed as a single integrated circuit chip. In other embodiments, impedance matching circuit 22 may also be formed on the integrated circuit chip.

Impedance matching circuits 14, 18, and 22 are of conventional design and each include a network of at least one inductor and at least one capacitor. Transformers may be used in some embodiments of circuits 14, 18, and 22. Amplifier circuits 12 and 16 are depicted as including a transistor, which illustrates various known amplifier configurations. In the depicted embodiment, for example, the input signal to the amplifier is received at the base terminal of one or more transistors and the amplified signal is output at the collector terminal(s). In one instance, power amplifier 16 includes several gallium arsenide npn heterojunction bipolar transistor (HBTs) connected in parallel and outputting signal $RF_{OUT}$ from a node common to all collector terminals.

Two sets (a set may include one element) of series-connected diodes are connected between the output node 24 of amplifier 16 and ground (e.g., chassis ground). Diode set 26, which includes subsets 26a and 26b, is forward biased, and diode set 28 is normally reverse biased. These diode sets 26,28 provide electrostatic discharge protection and both positive and negative overvoltage protection.

Collector voltage of the power amplifier transistor(s) at output node 24 is sampled at node 30 between diode sets 26a and 26b, which act as a voltage divider. In one embodiment, the band gap voltage is approximately 1.3 volts. The number of diodes used in sets 26a and 26b depends on the amplifier 16 collector voltage at which clamping is desired. In one embodiment, diode set 26b includes three diodes (three junctions). The number of diodes in diode set 26a is then set by the desired limiting peak voltage, which in one instance is selected to be twice the magnitude of the DC supply voltage. That is, the total number of diodes in sets 26a and 26b, multiplied by 1.3 volts per junction, is made equal to twice the magnitude of $V_{CC}$ applied to amplifier 16. Other numbers of diodes may be used.

The anode of peak-detector diode 32 is connected to node 30 and the cathode of diode 32 is connected to the base of emitter-follower buffer transistor 34. The cathode of diode 32 is also connected to ground via capacitor 36. Capacitor 36 is quickly charged to the peak detected level. The discharge time constant for capacitor 36 is designed to be long (relative to the modulation symbol rate in a digital modulated application) compared to normal envelope modulated periods to provide stable overvoltage protection loop operation.

The emitter output of transistor 34 is connected to the base of clamping transistor 38 via resistor 40 and to the base of clamping transistor 42 via resistor 44. The base and the collector of clamping transistor 38 are connected via capacitor 46. Similarly, the base and the collector of clamping transistor 42 are connected via capacitor 48. Capacitors 46 and 48 provide additional filtering in the protection loop response. The emitters of transistors 38 and 42 are connected to ground. The collector of transistor 38 is connected to the collector of bias transistor 50 in bias circuit 52. In the same way, the collector of transistor 42 is coupled to the collector of bias transistor 54 in bias circuit 56. DC bias reference voltage $V_{REF1}$ is output from the collector terminals of transistors 38,50 to power amplifier 16 and is used therein as base bias voltage. Likewise, DC bias reference voltage $V_{REF2}$ is output from the collector terminals of transistors 42,54 to amplifier 12 and is used therein as base bias voltage. The embodiment shown in FIG. 1 includes two amplifier stages. Hence, two bias circuit and clamping transistor combinations are used. In embodiments using other than two amplifier stages, a bias circuit and clamping transistor combination may be used for each one or more amplifier stage.

Referring to the circuits associated with amplifier 16 as an example, during normal operation in which amplifier 16 drives a reasonably matched load impedance, the voltage in signal $RF_{OUT}$ is insufficient to trigger the clamping operation of transistor 38. Without clamping transistor 38, voltage $V_{REF1}$ is established by the current in resistor 58, which is the combined collector current in transistor 50 and current being drawn by a device in amplifier 16. As amplifier 16 begins to drive a load with a mismatched impedance, the voltage of signal $RF_{OUT}$ increases. At a predetermined voltage set by the number of diodes (i.e., semiconductor junctions) in diode sets 26a and 26b, the effect of this increased signal $RF_{OUT}$ voltage causes current to flow through diode set 26, peak detector 32, and emitter follower buffer transistor 34 to the base of clamping transistor 38. When clamping transistor 38 conducts, the resistor 58 current increases. The increased resistor 58 current causes an increased voltage across resistor 58, and consequently the value of voltage $V_{REF1}$ is lowered. The lowered voltage $V_{REF1}$ lowers the current in amplifier 16, which in turn lowers the voltage of signal $RF_{OUT}$. The lowered amplifier 16 current corresponds to lowered amplifier 16 power output. Therefore, power dissipated by amplifier 16 due to the mismatched load is reduced and amplifier 16 remains undamaged. A similar action occurs in clamping transistor 42 and bias circuit 56 associated with amplifier 12, further reducing the power output by amplifier 16.

Figure 2:
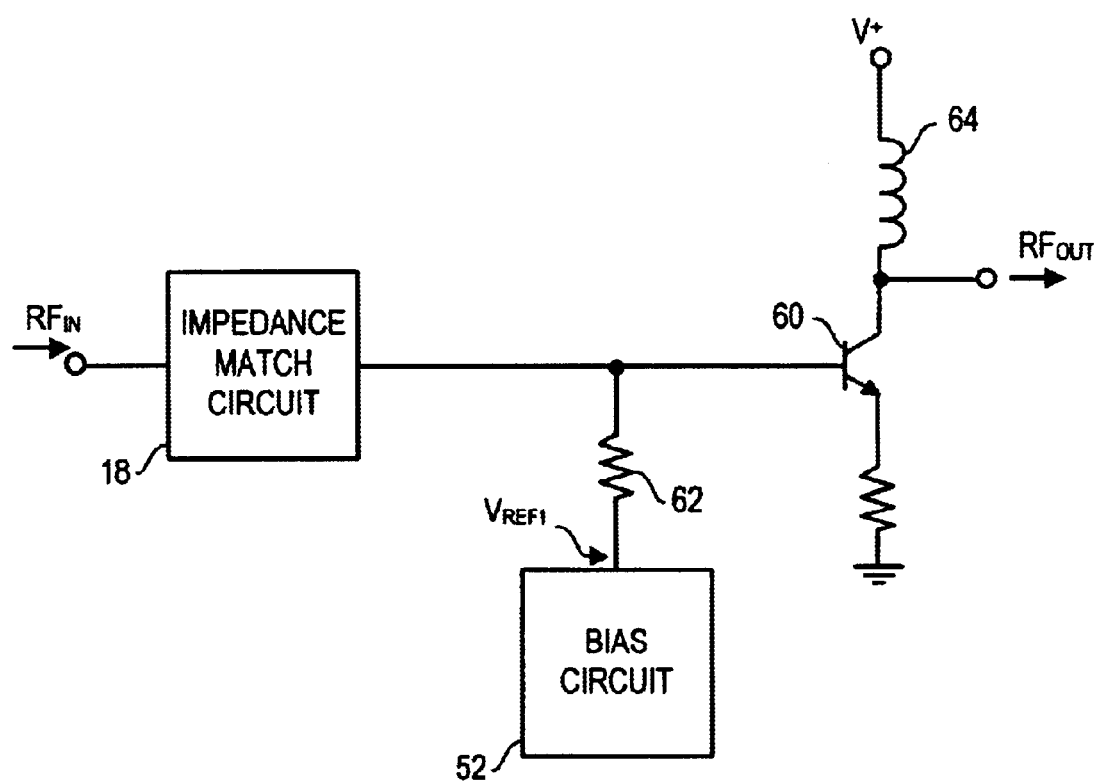
FIG. 2 is a combined diagrammatic and schematic view of an electronic amplifier.

FIG. 2 is a schematic view that shows electrical connections of an illustrative power amplifier transistor 60 in amplifier 16 which may include other similarly connected power amplifier transistors. In one embodiment, for example, transistor 60 is illustrative of one transistor cell of several GaAs HBT transistor cells having a common collector terminal. As shown in FIG. 2, the base of transistor 60 receives voltage VREF1 from bias circuit 52 via resistor 62 (e.g., a base ballast resistor). The base of transistor 60 also receives an RF signal for amplification from impedance match circuit 18. The emitter of transistor 60 is coupled to ground through a resistor. The collector of transistor 60 receives a DC supply voltage (e.g., VCC) via inductor 64 and outputs the amplified signal RFOUT. As voltage VREF1 is lowered, the base-emitter voltage of transistor 60 is lowered, and consequently the power output from transistor 60 is reduced. The circuit topology shown in FIG. 2 is also illustrative of amplifier 12 circuit topology.

TABLE I shows values of components in one embodiment. These values are illustrative and are not limiting.

TABLE I

| Component | Value | Component | Value |
| --- | --- | --- | --- |
| Resistor 40 | 500 Ohms | Capacitor 36 | 30 pF |
| Resistor 44 | 500 Ohms | Capacitor 46 | 5 pF |
| Transistor 34 | 45 $\mu m^2$ | Capacitor 48 | 5 pF |
| Transistor 38 | 45 $\mu m^2$ | | |
| Transistor 42 | 45 $\mu m^2$ | | |

The use of an integrated electrostatic discharge diode array to sense peak voltage in a protection loop to protect against over voltage conditions provides a structure and method that is simpler than more complicated circuits such as ones using directional couplers. Specific embodiments have been used to illustrate the invention, but skilled individuals will understand that various modifications and substitutions may be made. Therefore the invention is limited only by the following claims.

I claim:

1. An electronic circuit comprising:

a bias transistor comprising a base and a collector, the bias transistor outputting a reference DC bias voltage to a power amplifier;

a clamping transistor comprising a base and a collector, the collector of the clamping transistor being coupled to the collector of the bias transistor;

a buffer transistor comprising a base and an emitter, the emitter of the buffer transistor being coupled to the base of the clamping transistor;

a peak detector diode comprising an anode and a cathode, the cathode of the peak detector diode being coupled to the base of the buffer transistor;

a first set of diodes and a second set of diodes, wherein the first set of diodes is coupled between an output of the power amplifier and the anode of the peak detector diode, and wherein the second set of diodes is coupled between the anode of the peak detector diode and a ground.

2. The circuit of claim 1 further comprising a capacitor coupled between the base of the clamping transistor and the collector of the clamping transistor.

3. The circuit of claim 1 further comprising a capacitor coupled between the cathode of the peak detector diode and the ground.

4. The circuit of claim 1, wherein:

the power amplifier comprises an amplifying transistor;

the amplifying transistor comprises a base and a collector;

the base of the amplifying transistor is coupled to the collector of the bias transistor; and the collector of the amplifying transistor is coupled to the first set of diodes.

5. The circuit of claim 1 further comprising a third set of diodes coupled between the output of the power amplifier and the ground.

6. The circuit of claim 1, wherein the power amplifier is a final stage amplifier in a cellular telephone handset.

7. The circuit of claim 1, wherein the power amplifier is a radio frequency amplifier.

8. The electronic circuit of claim 1, wherein the emitter of the buffer transistor is coupled to the base of the clamping transistor through a resistor.

9. The electronic circuit of claim 1, further comprising:

a first amplifier, wherein the power amplifier receives a signal amplified by the first amplifier;

a second bias circuit coupled to an input of the first amplifier; and a second clamping transistor including a base and a collector, wherein the base of the second clamping transistor is coupled to the emitter of the buffer transistor, and the collector of the second clamping transistor is coupled to the input of the first amplifier.

10. The electronic circuit of claim 9, wherein the second bias circuit includes a second bias transistor, the second bias transistor including a collector coupled to the input of the first amplifier and to the collector of the second clamping transistor.

11. An electronic circuit comprising:

an impedance match circuit comprising an input and an output;

a first amplifier comprising an output coupled to the input of the match circuit;

a power amplifier comprising an input coupled to the output of the match circuit;

a bias transistor comprising a base and a collector, the bias transistor outputting a reference DC bias voltage to the first amplifier;

a clamping transistor comprising a base and a collector, the collector of the clamping transistor being coupled to the collector of the bias transistor;

a buffer transistor comprising a base and an emitter, the emitter of the buffer transistor being coupled to the base of the clamping transistor;

a peak detector diode comprising an anode and a cathode, the cathode of the peak detector diode being coupled to the base of the buffer transistor;

a first set of diodes and a second set of diodes, wherein the first set of diodes is coupled between an output of the power amplifier and the anode of the peak detector diode, and wherein the second set of diodes is coupled between the anode of the peak detector diode and a ground.

12. The circuit of claim 11 further comprising a capacitor coupled between the base of the clamping transistor and the collector of the clamping transistor.

13. The circuit of claim 11 further comprising a capacitor coupled between the cathode of the peak detector diode and the ground.

14. The circuit of claim 11, wherein:

the first amplifier comprises an amplifying transistor;

the amplifying transistor comprises a base and a collector;

the base of the amplifying transistor is coupled to the collector of the bias transistor; and the collector of the amplifying transistor is coupled to the input of the impedance match circuit.

15. The circuit of claim 11 further comprising a third set of diodes coupled between the output of the power amplifier and the ground.

16. The circuit of claim 11, wherein the power amplifier is a final stage amplifier in a cellular telephone handset.

17. The circuit of claim 11, wherein the first amplifier and the power amplifier are radio frequency amplifiers.

18. The electronic circuit of claim 11, wherein the emitter of the buffer transistor is coupled to the base of the clamping transistor through a resistor.

19. The electronic circuit of claim 11, further comprising a bias circuit coupled to the input of the power amplifier, and a second clamping transistor coupled to the input of the power amplifier and to the emitter of the buffer transistor.

20. A method of protecting a power amplifier, comprising the acts of:

outputting a reference DC bias voltage from a bias circuit to a power amplifier;

detecting an overpeak voltage output of the power amplifier; and using a clamping transistor to reduce the reference DC bias voltage in response to the detected overpeak voltage, wherein using the clamping transistor comprises shunting current from a collector of a bias transistor outputting the reference DC bias voltage.

21. The method of claim 20, wherein detecting the overpeak voltage comprises using a peak detector diode.

22. The method of claim 20, wherein detecting the overpeak voltage comprises using a set of diodes connected in series.

23. The method of claim 20, further comprising:

providing a first signal to an input of a first amplifier;

amplifying the first signal in the first amplifier;

providing the first signal from the first amplifier to the power amplifier;

impedance matching between the first amplifier and the power amplifier; and amplifying the first signal in the power amplifier and outputting the first signal from the power amplifier.

24. The method of claim 23, further comprising:

outputting a second reference DC bias voltage from a second bias circuit to the input the first amplifier;

using a second clamping transistor to reduce the second reference DC bias voltage in response to the detected overpeak voltage.

25. The method of claim 24, wherein using the second clamping transistor comprises shunting current from a collector of a bias transistor outputting the second reference DC bias voltage.

26. The method of claim 20, wherein detecting the overpeak voltage comprises providing a string of diodes coupled to an output of the power amplifier and using a peak detector coupled to an internal node of the string of diodes; and wherein the clamping transistor is controlled by a first signal output by the peak detector.

27. The method of claim 26, wherein the clamping transistor receives the first signal through a buffer.

28. A method of protecting a power amplifier, comprising the acts of:
- providing an impedance match circuit comprising an input and an output;
- coupling an output of a first amplifier to the input of the match circuit and an input of the power amplifier to the output of the match circuit;
- outputting a reference DC bias voltage from a bias circuit to the first amplifier;
- detecting an overpeak voltage output of the power amplifier; and
- using a clamping transistor to reduce the reference DC bias voltage in response to the detected overpeak voltage.

29. The method of claim 28, wherein detecting the overpeak voltage comprises using a peak detector diode.

30. The method of claim 28, wherein detecting the overpeak voltage comprises using a set of diodes connected in series.

31. The method of claim 28, wherein using a clamping transistor comprises shunting current from a collector of a bias transistor outputting the reference DC bias voltage.

32. The method of claim 31, wherein detecting the overpeak voltage comprises using a peak detector coupled to an internal node of a string of diodes that is coupled to an output of the power amplifier.

33. The method of claim 32, wherein the clamping transistor is controlled by a signal received from the peak detector through a buffer.

34. An electronic circuit comprising:
- a first amplifier coupled in series with a power amplifier;
- an impedance match circuit coupled between the first amplifier and the power amplifier;
- a bias circuit coupled to provide a reference DC bias voltage to an input of at least one of the first amplifier and the power amplifier;
- a clamping transistor comprising a base and a collector, the collector of the clamping transistor being coupled to the input of the at least one of the first amplifier and the power amplifier receiving the reference DC bias voltage;
- a buffer having an input and an output, wherein the output of the buffer is coupled to the base of the clamping transistor; and
- a peak detector having an input, and an output coupled to the input of the buffer; and
- a string of diodes coupled to an output of the power amplifier, wherein the input of the peak detector is coupled to the string of diodes.

35. The electronic circuit of claim 34, wherein the bias circuit is coupled to provide the reference DC bias to the input of the power amplifier.

36. The electronic circuit of claim 34, wherein the bias circuit is coupled to provide the reference DC bias to the input of the first amplifier.

37. A method of protecting a power amplifier, comprising the acts of:
- amplifying a first signal in a first amplifier;
- receiving the amplified first signal in the power amplifier, and outputting a further amplified first signal from the power amplifier;
- impedance matching between the first amplifier and the power amplifier;
- providing a reference DC bias voltage to an input of at least one of the first amplifier and the power amplifier;
- detecting an overpeak voltage output of the power amplifier; and
- using a clamping transistor to reduce the reference DC bias voltage in response to the detected overpeak voltage, wherein using the clamping transistor comprises shunting current from the input of the at least one of the first amplifier and the power amplifier receiving the reference DC bias voltage.

38. The method of claim 37, wherein the reference DC bias voltage is provided to the input of the first amplifier.

39. The method of claim 37, wherein the reference DC bias voltage is provided to the input of the power amplifier.

40. The method of claim 39, wherein a second reference DC bias is provided to the input of the first amplifier, and further comprising:
- using a second clamping transistor to reduce the second reference DC bias voltage in response to the detected overpeak voltage, wherein using the second clamping transistor comprises shunting current from the input of the first amplifier.

* * * * *